United States Patent
Markovic et al.

(10) Patent No.: US 6,806,739 B2
(45) Date of Patent: Oct. 19, 2004

(54) TIME-BORROWING N-ONLY CLOCKED CYCLE LATCH

(75) Inventors: Dejan Markovic, Berkeley, CA (US); James W. Tschanz, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/330,544

(22) Filed: Dec. 30, 2002

(65) Prior Publication Data

US 2004/0124883 A1 Jul. 1, 2004

(51) Int. Cl.[7] .............................................. H03K 19/094
(52) U.S. Cl. ........................... 326/113; 326/98; 326/95; 327/216; 327/198; 327/142
(58) Field of Search ............... 326/93, 95, 98, 326/113; 327/216–218, 175, 142, 198

(56) References Cited

U.S. PATENT DOCUMENTS

| | | | |
|---|---|---|---|
| 5,831,452 A | * 11/1998 | Nowak et al. | 326/98 |
| 5,952,859 A | * 9/1999 | Kim et al. | 327/200 |
| 5,986,475 A | * 11/1999 | Kim et al. | 326/95 |
| 6,424,178 B1 | * 7/2002 | Harrison | 326/93 |
| 6,459,316 B1 | * 10/2002 | Vangal et al. | 327/202 |
| 6,590,423 B1 | * 7/2003 | Wong | 326/93 |
| 6,642,765 B2 | * 11/2003 | Markovic et al. | 327/211 |

OTHER PUBLICATIONS

James Tschanz et al. Microprocessor Research Labs, Intel Corporation; "Comparative Delay and Energy of Single Edge–Triggered & Dual Edge–Triggered Pulsed Flip–Flops for High–Performance Microprocessors;" pp. 147–152, no date.

FA 8.5: Flow–Through Latch and Edge–Triggered Flip–flop Hybrid Elements; ISSC96/Session 8:/Digital Clocks and Latches/Paper FA 8.5; I1995 EEE International Solid State Circuits Conference; Digest of Technical Papers 138–139, Feb. 8, 1996.

* cited by examiner

*Primary Examiner*—Vibol Tan
(74) *Attorney, Agent, or Firm*—Fleshner & Kim, LLP

(57) ABSTRACT

A cycle latch includes a control circuit which increases the pull-up rate of a storage node by conditionally discharging the feedback node in a cross-coupled inverter keeper structure. The cycle latch includes an NMOS transistor switch for transferring an input value to the storage node, and two more NMOS transistors connected in series for performing the function of the control circuit. By connecting the storage node to a pre-discharged feedback node and then driving the latch with a low-swing clock, improved performance in terms of delay times, energy consumption, and robustness is achieved.

40 Claims, 5 Drawing Sheets

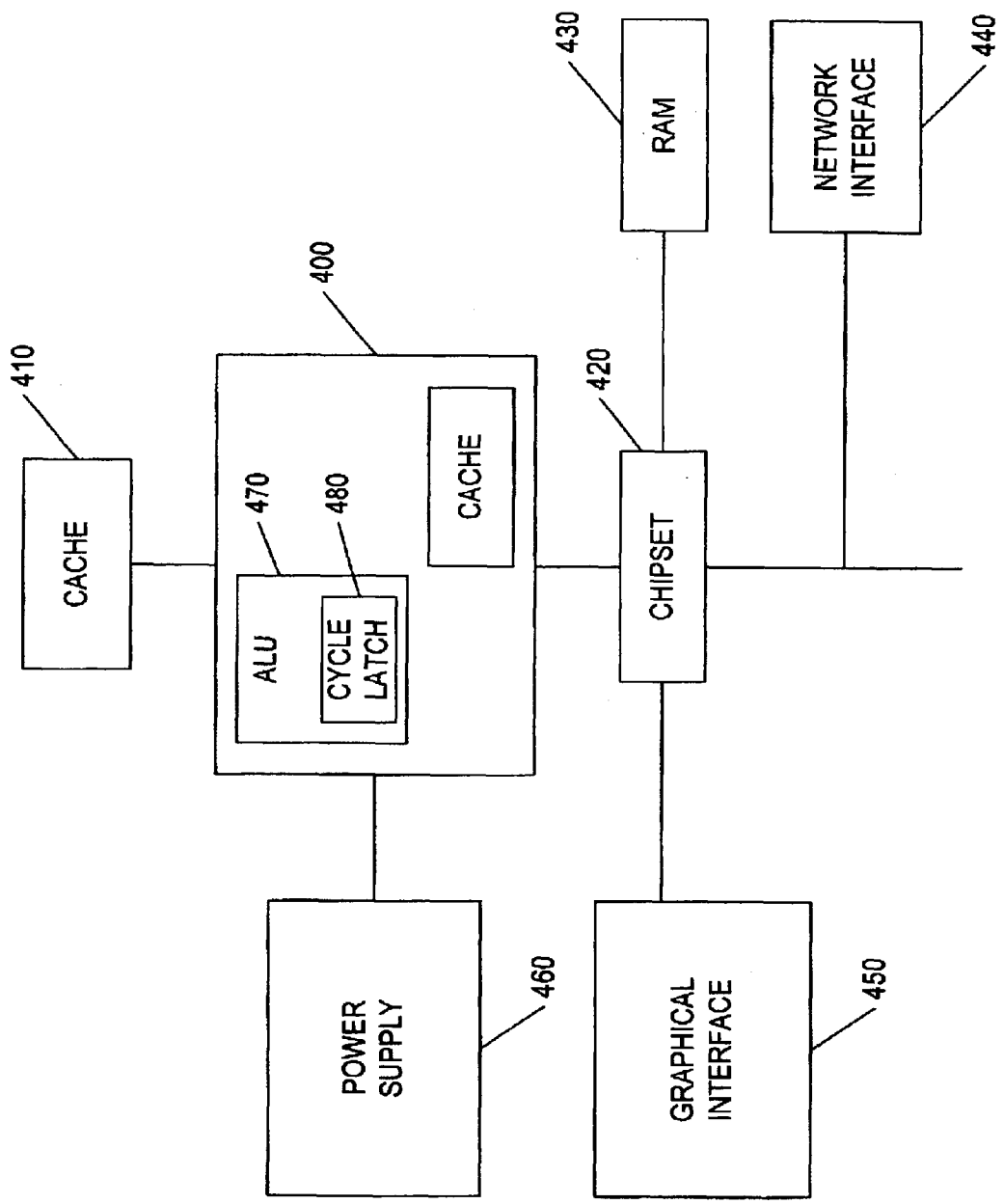

TIME-BORROWING N-ONLY CLOCKED CYCLE LATCH

BACKGROUND OF THE INVENTION

1. Field of the Invention

This invention generally relates to logic circuits used in processing systems.

2. Description of the Related Art

Register elements such as flip-flops and latches are used in microprocessor systems because inter alia they keep signals correlated in time. Modern designs require a large number of register elements. The exact number used depends on factors such as the speed and output load requirements of the implementing circuit. While fast flip-flops and latches enable short-cycle times and perform high-frequency operations, they often consume large amounts of energy. Various methods have been developed to reduce energy consumption by minimizing clocking energy. This may be accomplished by driving the register elements with a reduced-swing clock signal.

Most commonly used high-speed register elements are either based on hybrid latch-flip-flop configurations or pulse-triggered cycle latches. Both types of circuits demonstrate similar delay performance, however cycle latches exhibit lower energy consumption measured at the same delay, as well as better delay measured at the same energy. Cycle latches are clocked with a short pulse at each rising edge of the clock. This provides a short transparency period and requires only one latch per clock cycle. Hence, the name "cycle latch."

FIG. 1 shows an example of a type of cycle latch known as an explicit-pulsed static flip-flop (ep-SFF). This circuit is a D-type flip-flop which includes a switch 1 and four inverters numbered 2 through 5. The switch is in the form of a transmission gate which contains a parallel connection of an NMOS transistor 6 and a PMOS transistor 7. In operation, the D input is transferred to a node Ss when clock signal Cpulse goes high. More specifically, when Cpulse goes high, the NMOS transistor is switched on and inverter 2 outputs a low signal, which, in turn, activates the PMOS transistor. As a result, the value of the D input is connected to node Ss and the logic value at node Ss is inverted by inverter 5 to output the value of the $\overline{Q}$ output.

The circuit formed by the connection of inverters 3 and 4 corresponds to a "keeper structure" which is basically a memory element. This circuit operates as a feedback structure that ensures that whatever value is written to node Ss when the transmission gate is on does not disappear when the transmission gate is turned off. For example, if the D input equals a logical zero, node Ss will also be pulled down to zero when the transmission gate turns on. This, in turn, causes node $q_{FB}$ to rise to a logical 1 value, which then feeds back through inverter 3 which again produces a logical zero at node Ss. So, even without the data input connected to node Ss, the value will be maintained. The inverters in the keeper structure may be made very weak (i.e., small transistor sizes) so that they can be overpowered by the transmission gate and therefore the value stored on node Ss can be changed. On the other hand, the inverters are made strong enough so that even if there is leakage on node Ss or $q_{FB}$, or noise coupled to these nodes from other circuits switching, the stored value will not be corrupted.

FIG. 2 shows a cycle latch circuit which achieves improved energy consumption efficiency over the ep-SFF discussed above. In this circuit, energy consumption is reduced by performing low-swing clock operation, which requires the clocking of one or more NMOS transistors. More specifically, this circuit includes a transistor 10 and a plurality of inverters 11 through 14. The transistor is an NMOS enhancement transistor, that is, one having a positive threshold voltage as used in any standard CMOS process. Inverter 12 is an inverter having an NMOS enable terminal 16 which is controlled by the output of inverter 11. When disabled, inverter 12 prevents the output from discharging to ground. The NMOS transistor is switched by a clock signal Cpulse in order to transfer a D input to a node Ss. This same clock signal is input into inverter 11. Because the clock signal only connects to NMOS transistors, the circuit may be referred to as an NMOS-only-clocked cycle latch.

Operation of the NMOS-only-clocked cycle latch circuit will now be described. When the D input is low and the clock signal Cpulse goes high, storage node Ss goes low and a high logic level is established at node $\overline{Q}$, which is the output of the cycle latch. This is because inverter 14 inverts the low signal level at node Ss to the high logic value. Inverter 11 inverts the high value of Cpulse into a low (or logical 0) value which turns off inverter 12 in the manner previously described. As a result, node Ss assumed a value which corresponds to the D input.

When the D input is high and clock signal Cpulse goes high, CN goes low and the pull-down of inverter 11 is disabled. At the same time, the high level of the D input propagates to the latch storage node Ss. Inverter 13 pulls down node $q_{FB}$ which in turn helps pull up node Ss to a full swing as a result of the inversion operation performed by inverter 12. More specifically, inverter 13 outputs a low level which pulls node $q_{FB}$ down to a low level. This low-level signal is then inverted by inverter 12, which outputs a high-level signal which pulls up the voltage at node Ss to full swing. This high logical level at node Ss is inverted by inverter 14 to a low logic level, which represents the $\overline{Q}$ output of the circuit.

The circuit formed by inverters 12 and 13 operates as a storage element for the circuit and operates in a manner similar to the keeper structure described in FIG. 1. Since storage node Ss is not immediately pulled up to a full swing, the rising transition at the D input takes a delay time to propagate to the $\overline{Q}$ output. The circuit of FIG. 2 may also perform low-swing clock operation that allows the circuit to become more energy efficient than the ep-SFF cycle latch discussed above. Low-swing operation refers to the case where the clock voltage Cpulse does not have to be equal to the supply voltage Vcc. For example, the supply voltage may be 1.2 V (supplying the inverters and other circuits on the chip) while the clock voltage may only be 0.6 V. The flip-flop will still work if the clock voltage is lower than supply voltage Vcc (low-swing), but the design in FIG. 1 will not. It is therefore clear that low-swing operation will allows the FIG. 2 circuit to achieve reduced energy consumption since energy is a function of voltage.

While the NMOS-only clocked cycle latch outperforms the ep-SFF circuit in terms of energy efficiency, it also has a number of drawbacks. For example, the NMOS-only circuit demonstrates very slow delay and thus has proven less robust than is desired in many modern applications. The reason for the slow delay may be attributed to the use of a single NMOS transistor as an input pass gate, rather than a full transmission gate 10 (i.e., one constructed from NMOS and PMOS transistors) as shown in FIG. 1. NMOS transistors such as transistor 10 perform well when transferring a logical level of 0 (when the D input=0), but are very slow when transferring a logical level of 1 (when the D input =1). In fact, if the D input is at supply voltage Vcc and NMOS pass gate 10 turned on, node Ss will only rise up to a value of Vcc–$V_{tn}$ before the transistor turns off. ($V_{tn}$ =threshold voltage of the NMOS transistor.) In order to get node Ss to rise all the way to Vcc, the keeper inverter 12 must pull it up the rest of the way. As a result, the flip-flop circuit performs very slowly when the data input is logical 1.

BRIEF DESCRIPTION OF THE DRAWINGS

FIG. 6 is a diagram of a processing system which includes a cycle latch in accordance with the present invention.

DESCRIPTION OF THE PREFERRED EMBODIMENTS

The present invention is a cycle latch which achieves improved performance in terms of delay times, energy consumption, and robustness compared with conventional circuits of this type. The present invention is also a method for controlling the operation of a cycle latch to achieve improved performance. The present invention is also a processing system which includes the improved cycle latch previously mentioned. The embodiments of the invention will now be described.

Figure 3:
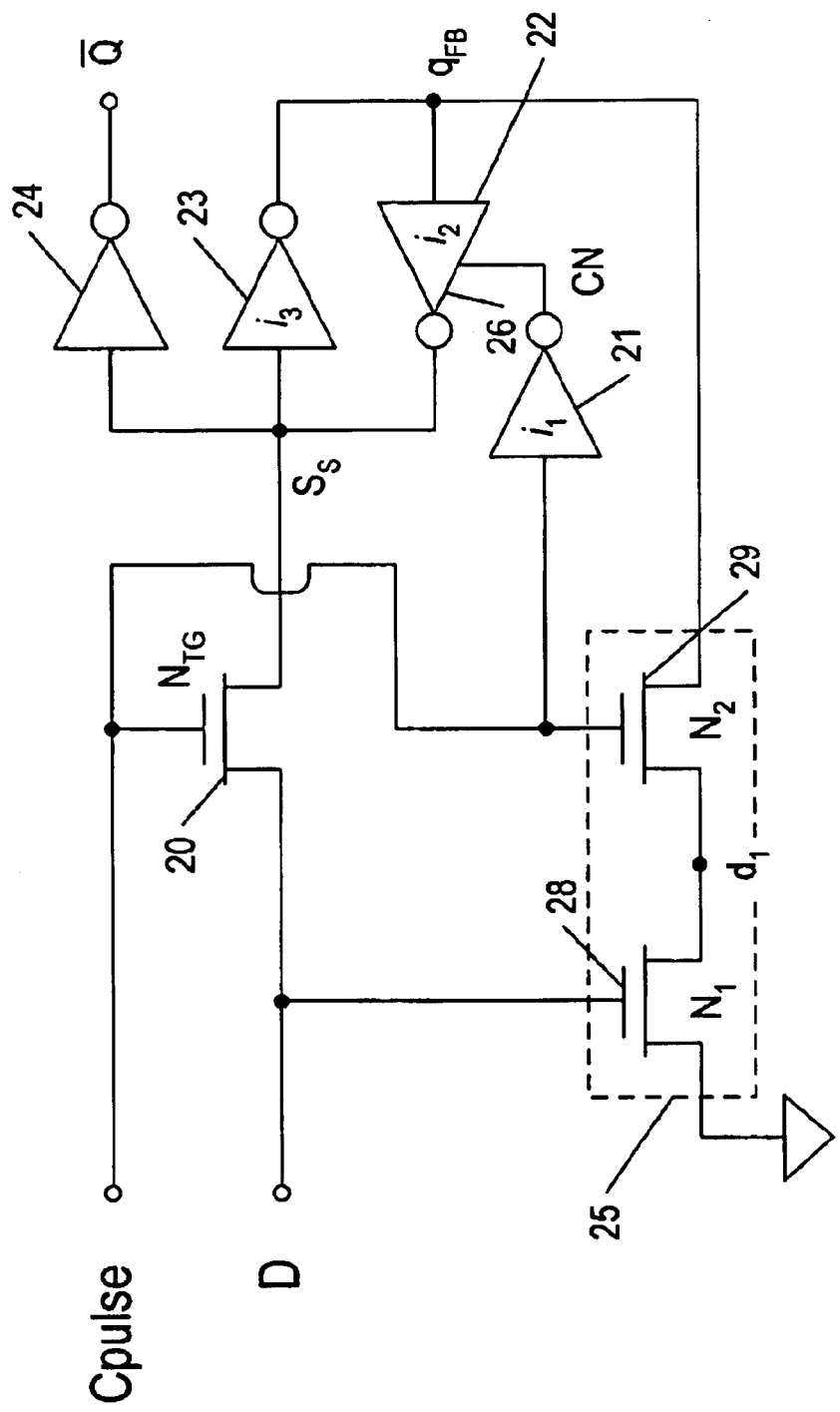
FIG. 3 is a diagram showing a configuration of an inverter with an NMOS enable.

FIG. 3 shows a cycle latch in accordance with a first embodiment of the present invention. In this embodiment, clock signals are only input into NMOS transistors. The cycle latch of the invention may therefore be referred to as an N-only clocked cycle latch. As will be described in greater detail, using only NMOS transistors for receiving clock signals is advantageous when the clock signal is in a low-swing state (i.e., when the clock signal operates at a value lower than the full supply voltage of Vcc) because transistors of this type fully turn off when required.

The N-only clocked cycle latch includes a transistor 20, a plurality of inverters 21 through 24, and a pull-down control circuit 25. Transistor 20 is an NMOS transistor which is switched by a clock signal Cpulse in order to transfer a logical value corresponding to the D input to a node Ss. This node is connected to the inputs of inverters 23 and 24 and receives the output of inverter 22, which is an inverter having an NMOS enable terminal 26 controlled by the output of inverter 21. The input of the latter-mentioned inverter is connected to receive clock signal Cpulse. The pull-down control circuit performs the function of pulling down the voltage of node $q_{FB}$. This circuit also allows node Ss to achieve a faster rate of recovery to a high logical level.

Figure 4:
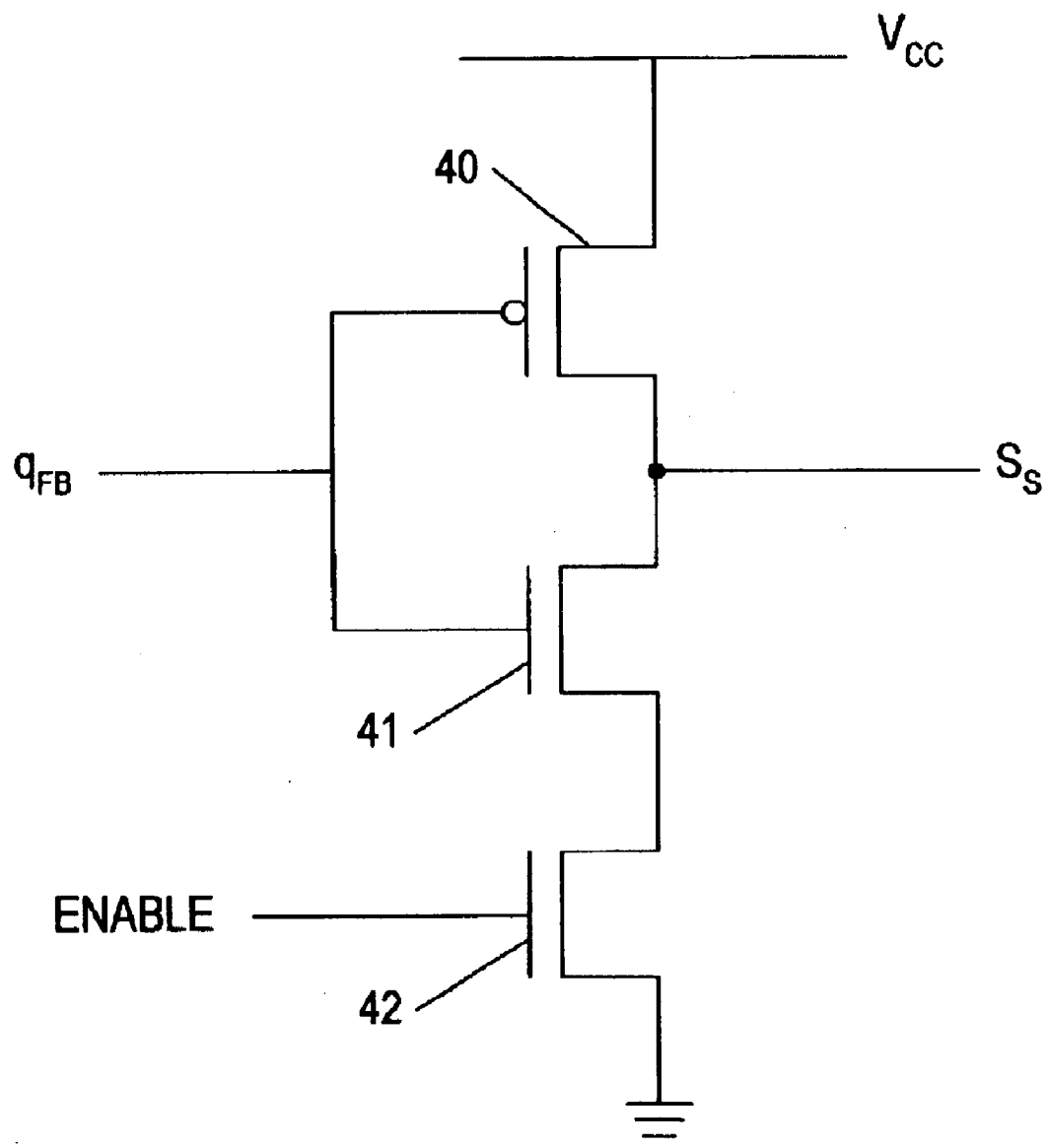
FIG. 4 is a cycle latch in accordance with a first embodiment of the present invention.

FIG. 4 shows an exemplary configuration of the inverter 22 with NMOS enable. As shown, this inverter includes a PMOS transistor 40 connected to an NMOS transistor 41. Node $q_{FB}$ connecting the gates of these transistors receives the output of inverter 23 and the output of the inverter 22 is connected to node Ss. An extra NMOS transistor 42 is connected to transistor 41 as an enable transistor. That is, the gate of transistor 42 is connected to the output of inverter 21 and therefore is used to enable or disable the pull-down path of the inverter structure.

The inverter with NMOS enable operates based on the logical values received on its enable and input terminals. When the enable input has a logical 1 value, inverter 22 operates as a regular inverter, i.e., when clock signal Cpulse is zero enable CN is 1. When Cpulse goes to a logical 1 value, inverter 21 outputs a CN logical value of 0, which turns off transistor 42 of inverter 22. If node $q_{FB}$ was storing a logical 1 at this time without the enable input, inverter 22 would actively pull node Ss down to,ground. Instead, when enable input CN goes to 0, the inverter turns off and thus node Ss is driven by the data input through NMOS transistor 20 without having to fight inverter 22. If the node $q_{FB}$ was storing a 0 value, the enable input has no effect. The enable input is usually placed on the NMOS stack of the inverter and not on the PMOS stack because NMOS transistors tend to be stronger than PMOS transistors and thus there is no reason to turn off the PMOS stack of the inverter. In addition, the PMOS stack may need to be un-interrupted in order to restore the swing on storage node Ss.

In accordance with the first embodiment of the invention, the pull-down control circuit includes two NMOS transistors 28 and 29 which are connected at node $d_1$. The source of transistor 28 is connected to a potential which is preferably ground and the drain of this transistor is connected to the source of transistor 29. The drain of transistor 29 is connected to node $q_{FB}$. (Here, "FB" stands for feedback.)

Operation of the N-only cycle latch according to the first embodiment of the present invention will now be described. When the D input is low, NMOS transistor 28 is switched off. If clock signal Cpulse is high at this time, transistor 29 will turns on but node $q_{FB}$ will not be pulled down to ground because transistor 28 is switched off. If clock signal Cpulse is low at this time, transistors 28 and 29 will both be switched off. Thus, irrespective of the logical value of Cpulse, the low value of the D input will causes the pull-down path established by control circuit 25 to be disabled. Moreover, the low value of Cpulse will cause inverter 21 to output a high value, which will operate to disable inverter 22, thereby pulling down the voltage at node Ss.

When the D input is high and Cpulse is high, transistors 28 and 29 are switched on. As a result, transistors 28 and 29 form a path to ground which helps pull down the voltage at node $q_{FB}$ to zero. At the same time, inverter 21 inverts the high Cpulse value to a low value. When this low value is input into the enable terminal of inverter 22, transistor 42 turns off and transistor 41 is also switched off as a result of the low value of node $q_{FB}$. The low value at this node turns on transistor 40 and as a result inverter 22 outputs a value corresponding to supply voltage Vcc, which operates to pull up node Ss to full-swing value (e.g., Vcc) when the high D input value passes to this node through transistor 20. The value at node Ss is then inverted by inverter 24 to generate the $\overline{Q}$ output of the cycle latch.

Figure 1:
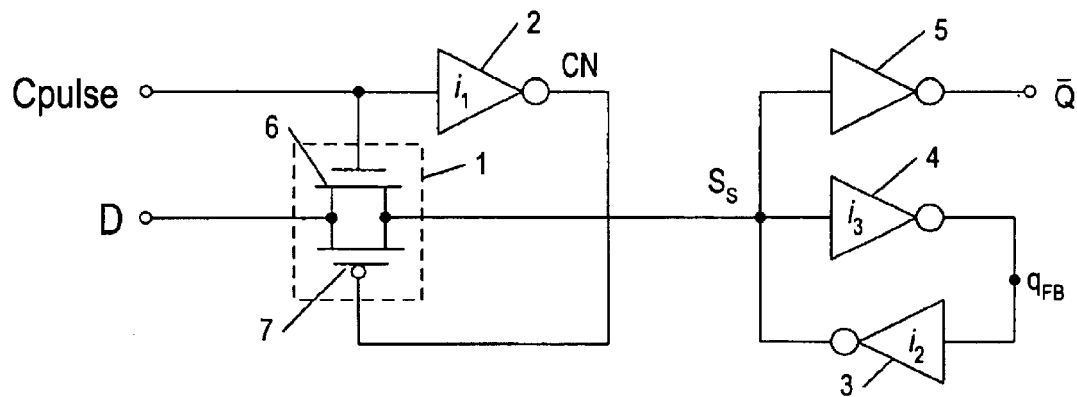
FIG. 1 is a diagram showing a first type of conventional cycle latch.
Figure 2:
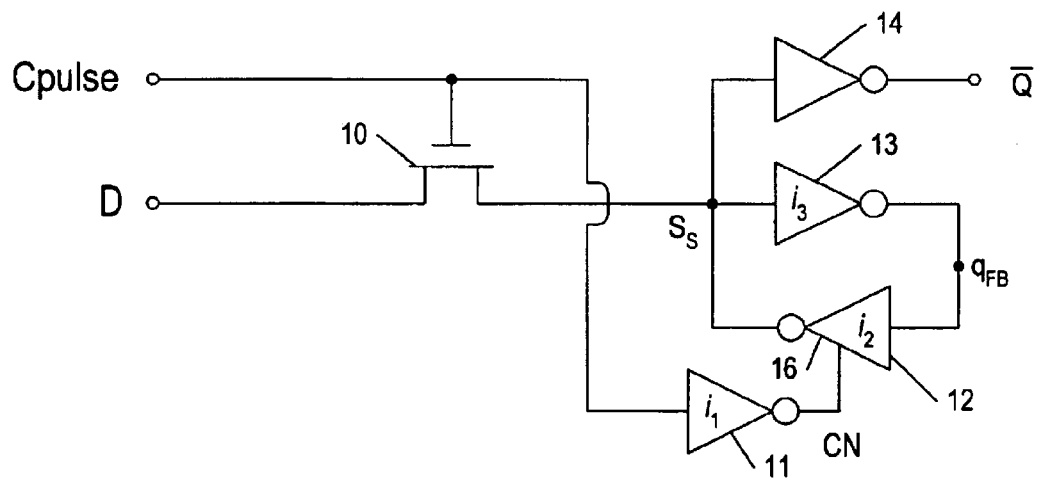
FIG. 2 is a diagram showing a second type of conventional cycle latch.

The control circuit allows the cycle latch of the present invention to achieve a number of advantages over its conventional counterpart shown in FIG. 2. For example, the control circuit establishes a path to ground which helps pull down the voltage at node $q_{FB}$. At the same time, the control circuit allows the storage node Ss to achieve a faster rate of recovery to a high level compared with the rate of recovery of nodes in conventional circuits.

In addition, the control circuit allows the latch of the present invention to achieve a faster delay compared with conventional circuits, and this improved performance is achieved with only a negligible increase in energy consumption requirements. In addition to these advantages, the control circuit allows the cycle latch of the invention to achieve better noise robustness. This is because a relatively stronger degree of pull-up of the latch storage node Ss is achieved using the control circuit of the invention.

Figure 5:
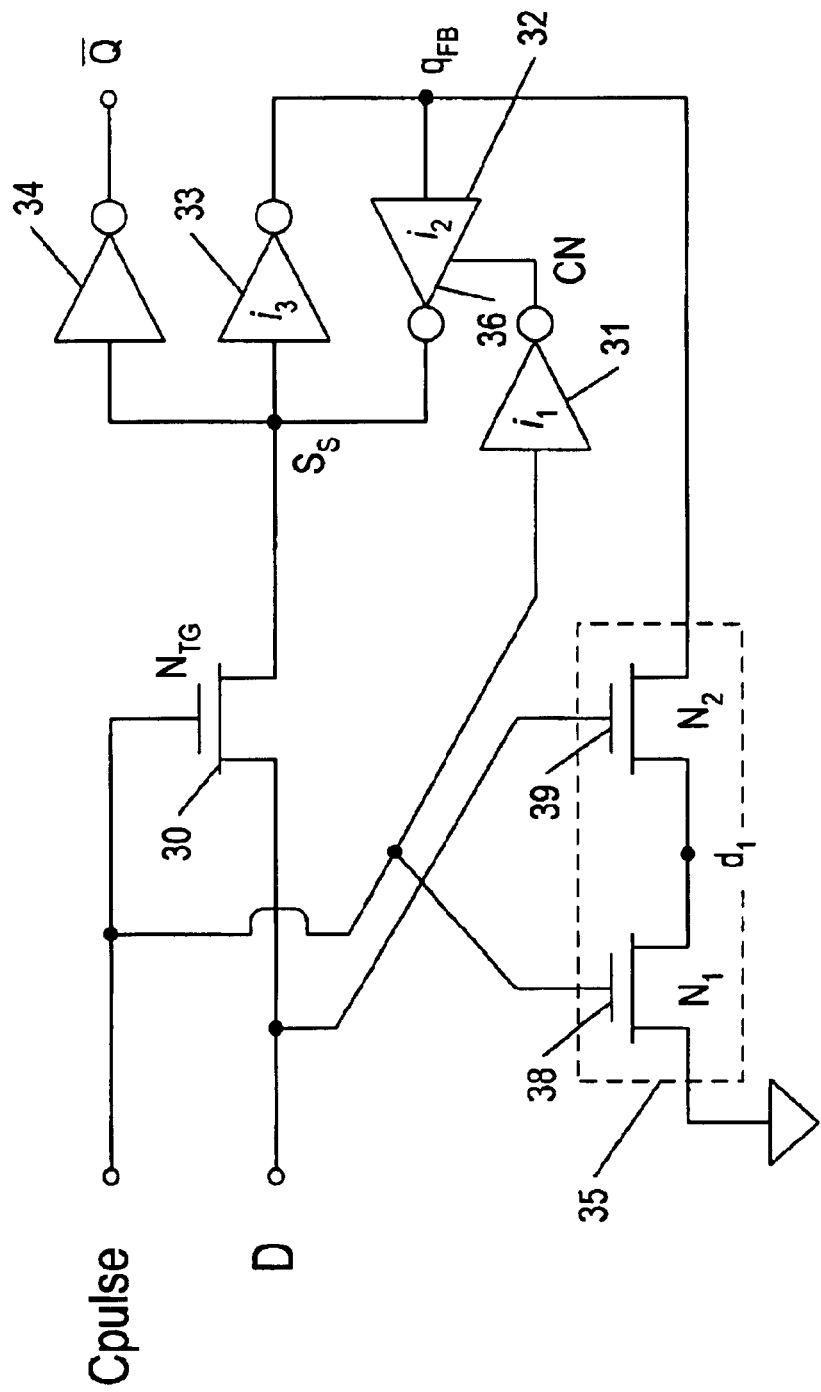
FIG. 5 is a diagram showing a cycle latch in accordance with a second embodiment of the present invention.

FIG. 5 shows a cycle latch in accordance with a second embodiment of the present invention. Like the previous embodiment, the clock signal is only input into NMOS transistors and therefore may also be referred to as an N-only clocked cycle latch.

The N-only clocked cycle latch includes a transistor 30, a plurality of inverters 31 through 34, and a pull-down control circuit 35. Transistor 30 is an NMOS transistor which is switched by clock signal Cpulse in order to transfer a logical value corresponding to the D input to a node Ss. This node is connected to the inputs of inverters 33 and 34 and receives the output of inverter 32, which is an inverter having an NMOS enable terminal 36 controlled by the output of inverter 31. The input of the latter-mentioned inverter is connected to receive clock signal Cpulse.

The pull-down control circuit performs the function of pulling down the voltage of node $q_{FB}$. This allows node Ss to achieve a faster rate of recovery to a high logical level as a result of supply voltage Vcc in inverter 32 being output to node Ss. More specifically, the control circuit preferably includes transistors 38 and 39 connected to node $d_1$. The drain of transistor 38 is connected to the source of transistor 39.

Unlike the first embodiment, the gate of transistor 38 is connected to clock signal Cpulse and the gate of transistor 39 is connected to the D input. This manner of attachment forms a time-borrowing circuit. More specifically, the second embodiment of the cycle latch of the present invention inherently possesses negative set-up time, which means that the D input is allowed to set up to a new logical value after clock signal Cpulse goes high. This property is leveraged in the cycle latch by cross-connecting the gate signals of transistors 38 and 39 in the above-described manner. Operation of this circuit is as follows.

When clock signal Cpulse goes high and the D input is low, the drain $d_1$ of transistor 38 is pulled down. However, transistor 39 is switched off, thereby isolating node $d_1$ from feedback node $q_{FB}$. The control circuit therefore does not pull down the voltage at the feedback node at this time.

When the D input goes high at a time when Cpulse is also high, transistor 38 and 39 are both switched on to thereby form a pull-down path for feedback node $q_{FB}$. Since node $d_1$ was already discharged to a low value before the D input transitioned from low to high, the voltage stored on node $q_{FB}$ is discharged at a faster rate than in the circuit of FIG. 3, where node $d_1$ is precharged. As a result, the voltage at storage node Ss is pulled up at a comparatively faster rate, after which it is inverted by inverter 34 to output a value corresponding to $\overline{Q}$. Discharging node $q_{FB}$ at this faster rate provides additional delay improvement over the first embodiment with no corresponding increase in energy consumption.

FIG. 6 shows a processing system in accordance with one embodiment of the present invention. The processing system includes a processor 400 such as but not limited to a microprocessor, an optional cache 410, an optional chipset 420, a memory 430 such as but not limited to a random access memory, an optional network interface 440, an optional graphical interface 450, and a power supply 460.

The processor may contain, for example, an arithmetic logic unit (ALU) 470 and an internal cache. As shown, the ALU includes a cycle latch 480 in accordance with any of the embodiments of the present invention described herein. Those skilled in the art can appreciate, however, that the cycle latch may be included in any digital circuit of the processing system and especially those considered to be performance-critical blocks.

The embodiments of the cycle latch of the present invention are advantageous because they enable faster propagation of the rising transition of the input signal compared with conventional circuits of this type. The cycle latch of the present invention also achieves faster delay while consuming less energy and achieving more robust operation.

In addition to these benefits, the cycle latch of the present invention enables the use of a low-swing clock which reduces energy consumption to an even greater extent. For example, when the clock operates at reduced swing (e.g., 0.7 times the full-rail swing), the cycle latch of the invention achieves both shorter delay and lower energy consumption compared with its conventional counterparts. This low-swing clock operation directly translates into quadratic benefit in the clocking energy and overall energy reduction which is imperative in many microprocessor designs for driving cooling costs down and enabling greater design flexibility. Low-swing clock operation is not possible in conventional cycle latches and therefore these latches cannot achieve any of these benefits.

The embodiments of the present invention are suitable for use in performance-critical paths of a microprocessor dual-supply voltage implementations. Those skilled in the art can appreciate, however, that additional applications are possible. For example, in addition to a dual-supply voltage implementation, the cycle latch of the present invention may be used in non-microprocessor applications including but not limited to applications performed in the chipset, network interface, ASICs, graphics processors, and communications circuits to name a few.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A cycle latch, comprising:
   a memory element including a storage node and a feedback node;
   a switch for transferring an input value to the storage node; and
   a control unit which pulls down a voltage of the feedback node to a first predetermined value when the input value transitions from a first logical value to a second logical value, wherein the memory element further includes a first inverter and a second inverter with an NMOS enable connected in a loop, and wherein the storage node is connected to an input of the first inverter and an output of the second inverter and the feedback node is connected to an output of the first inverter and the input of the second inverter.

2. The cycle latch of claim 1, wherein the control unit pulls down the voltage of the feedback node to said first predetermined value by connecting the feedback node to a reference potential when the input value transitions from said first logical value to said second logical value.

3. The cycle latch of claim 2, wherein the control unit includes:
a first NMOS transistor having a gate which receives said input value; and
a second NMOS transistor connected in series to the first NMOS transistor and having a gate which receives a clock signal, wherein the first NMOS transistor and the second NMOS transistor connect the feedback node to said reference potential when the clock signal is received and the input value transitions to said second logical value.

4. The cycle latch of claim 2, wherein the control unit includes:
a first NMOS transistor; and
a second NMOS transistor connected in series to the first NMOS transistor,
wherein the first NMOS transistor is switched by a clock signal and the second NMOS transistor is switched by the input value to connect the feedback node to a reference potential that pulls the feedback node down to said first predetermined value.

5. The cycle latch of claim 4, wherein the first NMOS transistor is switched by said clock signal to discharge a node between the first NMOS transistor and second NMOS transistor to said reference potential before said input value transitions from said first logical value to said second logical value.

6. The cycle latch of claim 5, wherein said reference potential is ground.

7. The cycle latch of claim 4, wherein said clock signal is a low-swing clock signal.

8. The cycle latch of claim 1, wherein the enabled inverter includes:
a supply voltage source;
a PMOS transistor connected to the supply voltage source;
a first NMOS transistor connected to the PMOS transistor; and
a second NMOS transistor connected between the first NMOS transistor and a reference potential, wherein a gate of the first NMOS transistor is connected to a gate of the PMOS switch and said feedback node, and wherein a gate of the second NMOS transistor is connected to receive an enable signal.

9. The cycle latch of claim 1, wherein the switch is an NMOS switch.

10. The cycle latch of claim 1, wherein the voltage of the storage node is pulled up to a second predetermined value when said feedback node is pulled down to said first predetermined value.

11. The cycle latch of claim 10, wherein the first predetermined value corresponds to a reference potential and the second predetermined value corresponds to a supply potential.

12. A method for controlling a cycle latch, comprising:
charging a storage node based on an input value when the input value assumes a predetermined logical state; and
supplying the storage node with supplemental voltage to reduce a time required for the storage node to reach a predetermined voltage, wherein the storage node is coupled to a loop which includes a feedback node between first and second inverters, wherein the supplemental voltage is supplied by pulling down a voltage of the feedback node to a reference potential when the input value assumes said predetermined logical state, and wherein the charging and supplying are performed based on a low-swing clock signal.

13. The method of claim 12, further comprising:
connecting a control node to the feedback node;
discharging the feedback node before the input value assumed said predetermined logical state; and
connecting the feedback node to the discharged control node when the input value assumes said logical state.

14. The method of claim 12, further comprising:
outputting a logical value based on a logical value of said storage node.

15. The method of claim 14, further comprising:
inverting the logical value of said storage node to generate the output logical value.

16. A processing system comprising:
a processor;
a cycle latch for providing logical signals within the processor, said cycle latch including:
(a) a memory element including a storage node and a feedback node;
(b) a switch for transferring an input value to the storage node; and
(c) a control unit which pulls down a voltage of the feedback node to a first predetermined value when the input value transitions from a first logical value to a second logical value, wherein the memory element further includes a first inverter and a second inverter with an NMOS enable connected in a loop, and wherein the storage node is connected to an input of the first inverter and an output of the second inverter and the feedback node is connected to an output of the first inverter and the input of the second inverter.

17. The processing system of claim 16, wherein the enabled inverter includes:
a supply voltage source;
a PMOS transistor connected to the supply voltage source;
a first NMOS transistor connected to the PMOS transistor; and
a second NMOS transistor connected between the first NMOS transistor and a reference potential, wherein a gate of the first NMOS transistor is connected to a gate of the PMOS switch and said feedback node, and wherein a gate of the second NMOS transistor is connected to receive an enable signal.

18. The cycle latch of claim 16, wherein the switch is an NMOS switch.

19. The processing system of claim 16, wherein the control unit includes:
a first NMOS transistor; and
a second NMOS transistor connected in series to the switch,
wherein the first NMOS transistor is switched by a clock signal and the second NMOS is switched by the input value to connect the feedback node to a reference potential that pulls the feedback node down to said first predetermined value.

20. The cycle latch of claim 19, wherein the first NMOS transistor is switched by said clock signal to discharge a node between the first NMOS transistor and second NMOS transistor to said reference potential before said input value transitions from said first logical value to said second logical value.

21. The processing system of claim 16, wherein the control unit pulls down the voltage of the feedback node to said first predetermined value by connecting the feedback node to a reference potential when the input value transitions from said first logical value to said second logical value.

22. The processing system of claim 21, wherein the control unit includes:
   a first NMOS transistor having a gate which receives said input value; and
   a second NMOS transistor connected in series to the first NMOS transistor and having a gate which receives a clock signal, wherein the first NMOS transistor and the second NMOS transistor connect the feedback node to said reference value when the clock signal is received and the input value transitions to said second logical value.

23. The cycle latch of claim 16, wherein the switch is an NMOS switch.

24. The processing system of claim 16, wherein the voltage of the storage node is pulled up to a second predetermined value when said feedback node is pulled down to said first predetermined value.

25. The processing system of claim 24, wherein the first predetermined value corresponds to a reference potential and the second predetermined value corresponds to a supply potential.

26. A cycle latch, comprising:
   a memory element including a storage node and a feedback node;
   a switch for transferring an input value to the storage node; and
   a control unit which pulls down a voltage of the feedback node to a first predetermined value when the input value transitions from a first logical value to a second logical value, wherein the voltage of the storage node is pulled up to a second predetermined value when said feedback node is pulled down to said first predetermined value, wherein the first predetermined value corresponds to a reference potential and the second predetermined value corresponds to a supply potential, and wherein the memory element further includes:
   a first inverter; and
   a second inverter with an enable,
   wherein the first inverter and second inverter are connected in a loop, the storage node is connected to an input of the first inverter and an output of the second inverter, and the feedback node is connected to an output of the first inverter and the input of the second inverter.

27. The cycle latch of claim 26, wherein the switch is an NMOS switch.

28. The cycle latch of claim 26, wherein the second inverter is an NMOS enabled inverter.

29. The cycle latch of claim 26, wherein the enabled inverter includes:
   a supply voltage source;
   a PMOS transistor connected to the supply voltage source;
   a first NMOS transistor connected to the PMOS transistor; and
   a second NMOS transistor connected between the first NMOS transistor and a reference potential, wherein a gate of the first NMOS transistor is connected to a gate of the PMOS switch and said feedback node, and wherein a gate of the second NMOS transistor is connected to receive an enable signal.

30. The cycle latch of claim 26, wherein said reference potential is ground.

31. A cycle latch, comprising:
   a memory element including a storage node and a feedback node;
   a switch for transferring an input value to the storage node; and
   a control unit which pulls down a voltage of the feedback node to a first predetermined value when the input value transitions from a first logical value to a second logical value, wherein the voltage of the storage node is pulled up to a second predetermined value when said feedback node is pulled down to said first predetermined value, wherein the first predetermined value corresponds to a reference potential and the second predetermined value corresponds to a supply potential, and wherein the control unit includes:
   a first NMOS transistor having a gate which receives said input value; and
   a second NMOS transistor connected in series to the first NMOS transistor and having a gate which receives a clock signal, wherein the first NMOS transistor and the second NMOS transistor connect the feedback node to said reference value when the clock signal is received and the input value transitions to said second logical value.

32. A cycle latch, comprising:
   a memory element including a storage node and a feedback node;
   a switch for transferring an input value to the storage node; and
   a control unit which pulls down a voltage of the feedback node to a first predetermined value when the input value transitions from a first logical value to a second logical value, wherein the voltage of the storage node is pulled up to a second predetermined value when said feedback node is pulled down to said first predetermined value, and wherein the first predetermined value corresponds to a reference potential and the second predetermined value corresponds to a supply potential, and wherein the control unit includes:
   a first NMOS transistor; and
   a second NMOS transistor connected in series to the first NMOS transistor,
   wherein the first NMOS transistor is switched by a clock signal and the second NMOS transistor is switched by the input value to connect the feedback node to a reference potential that pulls the feedback node down to said first predetermined value.

33. The cycle latch of claim 32, wherein said clock signal is a low-swing clock signal.

34. The cycle latch of claim 32, wherein the first NMOS transistor is switched by said clock signal to discharge a node between the first NMOS transistor and second NMOS transistor to said reference potential before said input value transitions from said first logical value to said second logical value.

35. A method for controlling a cycle latch, comprising:
   transferring an input value to a memory element, said memory element including first inverter and a second inverter with an NMOS enable connected in a loop, a storage node coupled to an input of the first inverter and an output of the second inverter, and a feedback node coupled to an output of the first inverter and the input of the second inverter; and pulling down a voltage of the feedback node to a first predetermined value when the input value transitions from a first logical value to a second logical value.

36. The method of claim 35, wherein pulling down the voltage of the feedback node includes:

connecting the feedback node to a reference potential when the input value transitions from said first logical value to said second logical value.

37. The method of claim 36, wherein the feedback node is connected to the reference potential through at least a first switch and a second switch, and wherein the first switch is activated when the input value transitions to the second logical value and the second switch is activated by a clock signal.

38. The method of claim 37, wherein the first switch is coupled between the second switch and the reference potential and the second switch is coupled between the first switch and the feedback node.

39. The method of claim 37, wherein the first switch is coupled between the second switch and feedback node and the second switch is coupled between the first switch and the reference potential.

40. A method for controlling a cycle latch, comprising:

transferring an input value to a memory element, said memory element including first and second inverters connected in a loop, a storage node coupled to an input of the first inverter and an output of the second inverter, and a feedback node coupled to an output of the first inverter and the input of the second inverter; and pulling down a voltage of the feedback node to a first predetermined value when the input value transitions from a first logical value to a second logical value, wherein the feedback node is connected to a reference potential through a swich when the input value transitions from said first logical value to said second logical value, and wherein the switch is controlled by a low-swing clock signal.

* * * * *